United States Patent
Kim et al.

(10) Patent No.: US 7,525,077 B2
(45) Date of Patent: Apr. 28, 2009

(54) CMOS ACTIVE PIXEL SENSOR AND ACTIVE PIXEL SENSOR ARRAY USING FINGERED TYPE SOURCE FOLLOWER TRANSISTOR

(75) Inventors: Young-Chan Kim, Seongnam-si (KR); Yi-Tae Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/348,125

(22) Filed: Feb. 6, 2006

(65) Prior Publication Data

US 2006/0175538 A1 Aug. 10, 2006

(30) Foreign Application Priority Data

Feb. 7, 2005 (KR) .................. 10-2005-0011126

(51) Int. Cl.
*H01L 27/00* (2006.01)
*H01L 31/062* (2006.01)

(52) U.S. Cl. .................. 250/208.1; 257/292

(58) Field of Classification Search ............. 250/208.1, 250/214 R; 348/241, 300, 301, 308; 257/292
See application file for complete search history.

(56) References Cited

U.S. PATENT DOCUMENTS

| | | | | |
|---|---|---|---|---|
| 6,897,519 | B1 * | 5/2005 | Dosluoglu | .............. 257/315 |
| 7,196,304 | B2 * | 3/2007 | Altice et al. | ............. 250/208.1 |
| 2004/0010765 | A1 * | 1/2004 | Jiang et al. | ...................... 716/9 |
| 2004/0031905 | A1 * | 2/2004 | Chan et al. | ............... 250/208.1 |
| 2004/0078768 | A1 * | 4/2004 | McGuinness et al. | .......... 716/8 |
| 2004/0135207 | A1 * | 7/2004 | Dosluoglu et al. | .......... 257/365 |
| 2004/0217398 | A1 * | 11/2004 | Lee | ............................. 257/292 |
| 2005/0012836 | A1 | 1/2005 | Guidash | |

FOREIGN PATENT DOCUMENTS

| | | |
|---|---|---|
| JP | 11-355668 | 12/1999 |
| JP | 2002-330348 | 11/2002 |
| JP | 2003-046865 | 2/2003 |
| JP | 2003-230055 | 8/2003 |
| KR | 1020040093989 A | 9/2004 |

OTHER PUBLICATIONS

Office Action dated Aug. 8, 2008 from the Chinese Patent Office in the corresponding Chinese Patent Application No. 2006100067308.

* cited by examiner

*Primary Examiner*—Thanh X Luu
(74) *Attorney, Agent, or Firm*—F. Chau & Assoc., LLC

(57) ABSTRACT

A CMOS active pixel sensor includes a photodiode, a transmitting transistor, a reset transistor, a fingered type source follower transistor and a selecting transistor, where the photodiode generates charge in response to incident light, the transmitting transistor transmits the charge stored in the photodiode to a sensing node, the reset transistor, coupled to a power supply voltage, resets a voltage of the sensing node so that the sensing node has substantially a level of the power supply voltage, the fingered type source follower transistor amplifies the voltage of the sensing node, the selecting transistor transmits a voltage of a source electrode of the fingered type source follower transistor into an internal circuit in response to a selection signal, thus, the channel width of the source follower transistor may be increased, and the MOS device noise due to the source follower transistor may be reduced.

8 Claims, 11 Drawing Sheets ps CMOS ACTIVE PIXEL SENSOR AND ACTIVE PIXEL SENSOR ARRAY USING FINGERED TYPE SOURCE FOLLOWER TRANSISTOR

CROSS-REFERENCE TO RELATED APPLICATION

This application claims foreign priority under 35 U.S.C. § 119 to Korean Patent Application No. 2005-11126 filed on Feb. 7, 2005 in the Korean Intellectual Property Office (KIPO), the entire contents of which are hereby incorporated by reference.

BACKGROUND

1. Field of the Invention

The present disclosure relates to active pixel sensors, and more particularly to Complementary Metal-Oxide Semiconductor (CMOS) active pixel sensors.

2. Description of the Related Art

An Active Pixel Sensor (APS) converts a photo image into an electrical signal, and is widely used in digital cameras, mobile phones having a camera, vision systems, and the like.

Active pixel sensors are classified into a Charge-Coupled Device (CCD) type and a Complementary Metal-Oxide Semiconductor (CMOS) type. The CCD type has less noise than the CMOS type and has better image quality than the CMOS type. In addition, the CCD type has disadvantages, with respect to manufacturing costs and power consumption, compared with the CMOS type. The CMOS type can be manufactured using a semiconductor manufacturing process, so that the CMOS type can be easily integrated into peripheral systems having an amplifying block and a signal-processing block. The CMOS type has reduced manufacturing costs, a higher processing speed and reduced power consumption compared with the CCD type.

A CMOS active pixel sensor generally has a 3-transistor configuration and a 4-transistor configuration. In the 4-transistor configuration, a CMOS active pixel sensor includes one photo diode and four MOS transistors. Here, the photo-generated charge integrated at the photo diode is sensed under the control of the four MOS transistors. In the 3-transistor configuration, a CMOS active pixel sensor includes one photo diode and three MOS transistors. Here, the photo-generated charge integrated at the photo diode is sensed under the control of the three-MOS transistors.

FIG. 1 is a circuit diagram illustrating a conventional CMOS active pixel sensor having the 4-transistor configuration. Referring to FIG. 1, the CMOS active pixel sensor 100 having the 4-transistor configuration includes a photo diode PD, a transmission transistor M11, a reset transistor M12, a source follower transistor M13 and a selection transistor M14.

When a gate voltage RG of the reset transistor M12 increases and the reset transistor M12 is turned on, a potential of a sensing node, i.e., a floating diffusion node FD, increases up to a level of a power supply voltage VDD. The potential of the floating diffusion node FD is sampled by the source follower transistor M13 and the selection transistor M14, and the sampled potential is a reference potential.

When light is incident onto the photo diode PD during a photo integration period, electron hole pairs (EHP) are generated in response to the incident light. The charges integrated (or stored) in the photo diode PD are transmitted to the floating diffusion node FD when a gate voltage TG of the transmission transistor M11 increases after the photo integration period. A potential of a source of the source follower transistor M13 is changed when the potential of the floating diffusion node FD decreases substantially in proportion to the quantity of the transmitted charge.

The selection transistor M14 is turned on when a gate voltage SEL of the selection transistor M14 increases, a source voltage of the source follower transistor M13 is outputted as an output voltage VOUT. A photo-sensing is accomplished by measuring the difference between the reference potential and the output voltage VOUT. Then, the reset operation is repeated.

FIG. 2 is a circuit diagram illustrating a conventional CMOS active pixel sensor having the 3-transistor configuration. Referring to FIG. 2, the CMOS active pixel sensor 200 having the 3-transistor configuration includes a photo diode PD, a transmission transistor M21, a reset transistor M22, and a source follower transistor M23.

The CMOS active pixel sensor 200 having the 3-transistor configuration may not include the transmission transistor M11 of FIG. 1. In addition, the CMOS active pixel sensor 200 having the 3-transistor configuration does not include the selection transistor M14 of FIG. 1 and uses a dynamic power supply voltage DVD.

The dynamic power supply voltage DVD is increased to a high power supply voltage when the potential of the floating diffusion node FD is reset and is sensed, and otherwise dynamic power supply voltage DVD maintains a low power supply voltage. The function of the selection transistor is performed by the dynamic power supply voltage DVD.

When a gate voltage RG of the reset transistor M22 increases and the reset transistor M22 is turned on while the dynamic power supply voltage DVD has the high power supply voltage, a potential of a sensing node, i.e., a floating diffusion node FD, increases up to a level of the high power supply voltage. The potential of the floating diffusion node FD is sampled by the source follower transistor M23 and the sampled potential is outputted to an internal circuit. The sampled potential is a reference potential. Afterwards, the dynamic power supply voltage DVD decreases to a low power supply voltage.

When light is incident onto the photo diode PD during the photo integration period, electron hole pairs (EHP) are generated in response to the incident light. The charges integrated (or stored) in the photo diode PD are transmitted to the floating diffusion node FD when a gate voltage TG of the transmission transistor M21 increases after the photo integration period. When a potential of the floating diffusion node FD decreases substantially in proportion to the quantity of the transmitted charges while the dynamic power supply voltage DVD has the high power supply voltage, a source voltage of the source follower transistor M23 is changed. The source voltage of the source follower transistor M23 is outputted as the output voltage VOUT to the internal circuit. Then, the reset operation is repeated as explained in FIG. 1.

The active pixel sensor senses a signal based on the potential variation of the floating diffusion node FD. Namely, the photo-sensing is accomplished by measuring the difference between the reference potential and the output voltage VOUT.

A resolution is an important factor in digital cameras and mobile phones having a digital camera. Thus, pixel size is an important design factor. In addition, as the pixel size decreases, it is difficult to maintain the image quality of the pixel sensor beyond a predetermined image quality. In particular, the CMOS active pixel sensor is restricted to an optically symmetrical structure due to the characteristics of the CMOS active pixel sensor and the decreasing sizes of the transistors in the pixel, so that the CMOS active pixel sensor is very vulnerable to noise.

SUMMARY OF THE INVENTION

Example embodiments of the present disclosure provide a Complementary Metal-Oxide Semiconductor (CMOS) active pixel sensor having a 4-transistor configuration using a fingered type source follower transistor.

Example embodiments of the present disclosure also provide a CMOS active pixel sensor array having the 4-transistor per sensor configuration using a fingered type source follower transistor.

Example embodiments of the present disclosure also provide a CMOS active pixel sensor having a 3-transistor configuration using a fingered type source follower transistor.

Example embodiments of the present disclosure also provide a CMOS active pixel sensor array having the 3-transistor configuration using a fingered type source follower transistor.

In some example embodiments, a CMOS active pixel sensor includes: a photodiode for generating charge in response to incident light; a transmitting transistor for transmitting the charge stored in the photodiode to a sensing node; a reset transistor, coupled to a power supply voltage, for resetting a voltage of the sensing node so that the sensing node has substantially a level of the power supply voltage; a fingered type source follower transistor for amplifying the voltage of the sensing node; and a selecting transistor for transmitting a voltage of a source electrode of the fingered type source follower transistor into an internal circuit in response to a selection signal.

The fingered type source follower transistor may have a drain electrode and a gate electrode, the drain electrode may be coupled to the power supply voltage, and the gate electrode may be folded and may be coupled to the voltage of the sensing node. The selecting transistor may be serially coupled between the power supply voltage and the drain electrode of the fingered type source follower transistor. The selecting transistor may be serially coupled to the source electrode of the fingered type source follower transistor.

In other example embodiments, a CMOS active pixel sensor includes: a photodiode for generating charge in response to incident light; a transmitting transistor for transmitting the charge stored in the photodiode to a sensing node; a dynamic voltage source for selectively providing a first power supply voltage and a second power supply voltage; a reset transistor, coupled to the dynamic voltage source, for resetting a voltage of the sensing node so that the sensing node has the first power supply voltage; and a fingered type source follower transistor having a drain electrode coupled to the dynamic voltage source, the fingered type source follower transistor receiving the voltage of the sensing node via a gate electrode to amplify the voltage of the sensing node and transmitting the amplified voltage into an internal circuit.

The dynamic voltage source may supply the first power supply voltage when the voltage of the sensing node is reset and the amplified voltage of the sensing node is transmitted into the internal circuit; otherwise, the dynamic voltage source may supply the second power supply voltage. The drain electrode of the fingered type source follower transistor may be coupled to the dynamic voltage source, the gate electrode of the fingered type source follower transistor may be folded and the voltage of the sensing node may be coupled to the gate electrode of the fingered type source follower transistor.

In still other example embodiments, a CMOS active pixel sensor array includes: a plurality of photodiodes for generating charge in response to incident light; a plurality of transmitting transistors for transmitting the charge stored in the photodiodes to a sensing node, the transmitting transistors respectively corresponding to the photodiodes; a reset transistor, coupled to a power supply voltage, for resetting a voltage of the sensing node so that the sensing node has a level of the power supply voltage; a fingered type source follower transistor for amplifying the voltage of the sensing node; and a selecting transistor for transmitting a voltage of a source electrode of the fingered type source follower transistor into an internal circuit in response to a selection signal.

In still other example embodiments, a CMOS active pixel sensor array includes: a plurality of photodiodes for generating charge in response to incident light; a plurality of transmitting transistors for transmitting the charge stored in the photodiode to a sensing node, and the transmitting transistors respectively corresponding to the photodiodes; a dynamic voltage source for selectively supplying a first power supply voltage and a second power supply voltage; a reset transistor, coupled to the dynamic voltage source, for resetting a voltage of the sensing node so that the sensing node has the first power supply voltage supplied from the dynamic voltage source; and a fingered type source follower transistor having a drain electrode coupled to the dynamic voltage source, the fingered type source follower transistor receiving the voltage of the sensing node via a gate electrode to amplify the voltage of the sensing node inputted and transmitting the amplified voltage into an internal circuit.

In still other example embodiments, a CMOS active pixel sensor includes: a sensing node; a photodiode in signal communication with the sensing node for generating charge in response to incident light; and a fingered type source follower transistor in signal communication with the sensing node for amplifying the voltage of the sensing node.

The CMOS active pixel sensor may further include a reset transistor in signal communication with the sensing node for resetting a voltage level of the sensing node.

The CMOS active pixel sensor may further include at least one of: a transmitting transistor in signal communication with the photodiode for transmitting the charge stored in the photodiode to the sensing node; a selecting transistor in signal communication with the fingered type source follower transistor for transmitting a voltage of a source electrode of the fingered type source follower transistor in response to a selection signal; or a dynamic voltage source in signal communication with the fingered type source follower transistor for selectively providing a first power supply voltage and a second power supply voltage to a drain electrode of the fingered type source follower transistor.

The reset transistor may be coupled to a power supply voltage for resetting a voltage of the sensing node to a level of the power supply voltage.

The power supply voltage may be a substantially static voltage and the CMOS active pixel sensor may further include at least one of: a transmitting transistor in signal communication with the photodiode for transmitting the charge stored in the photodiode to the sensing node; or a selecting transistor in signal communication with the fingered type source follower transistor for transmitting a voltage of a source electrode of the fingered type source follower transistor in response to a selection signal.

The power supply voltage may be a dynamic voltage and the CMOS active pixel sensor may further include a dynamic voltage source for selectively providing a first power supply voltage and a second power supply voltage to a drain electrode of the fingered type source follower transistor.

BRIEF DESCRIPTION OF THE DRAWINGS

Example embodiments of the present disclosure will become more apparent by describing in detail exemplary embodiments of the present disclosure with reference to the accompanying drawings, in which.

DETAILED DESCRIPTION OF PREFERRED EMBODIMENTS

Figure 1:
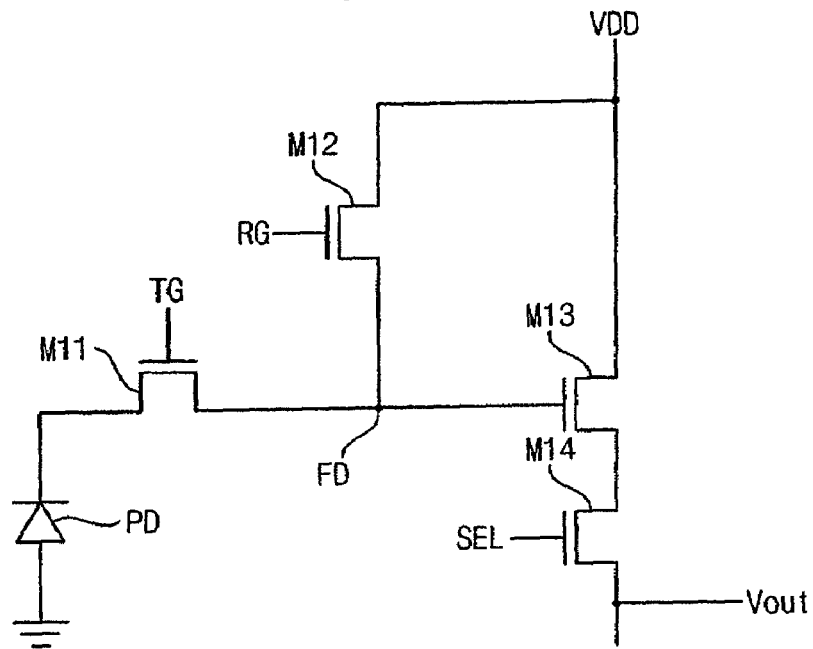
FIG. 1 is a circuit diagram illustrating a conventional Complementary Metal-Oxide Semiconductor (CMOS) active pixel sensor having a 4-transistor configuration.

Example embodiments of the present disclosure provide for a Complementary Metal-Oxide Semiconductor (CMOS) active pixel sensor having a fingered type source follower transistor and reduced device noise. It shall be understood that specific structural and functional details disclosed herein are merely representative for purposes of describing example embodiments of the present disclosure; in addition, example embodiments of the present disclosure may be embodied in many alternate forms and should not be construed as limited to example embodiments of the present disclosure set forth herein.

Accordingly, while the invention is susceptible to various modifications and alternative forms, specific embodiments thereof are shown by way of example in the drawings and will herein be described in detail. It should be understood, in addition, that there is no intent to limit the invention to the particular forms disclosed, but on the contrary, all modifications, equivalents, and alternatives falling within the spirit and scope of the invention are to be covered. Like reference numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the pertinent art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the kinds of noise that can be generated from a Complementary Metal-Oxide Semiconductor (CMOS) active pixel sensor are explained. Temporal random noise that is generated from a pixel can be represented by expression 1.

$$(\text{Total noise})^2 = (\text{dark current shot noise})^2 + (\text{pixel photon shot noise})^2 + (\text{MOS device noise})^2 \qquad <\text{Expression 1}>$$

The dark current shot noise is related with noise due to a leakage current of a photo diode. The pixel photon shot noise is an intrinsic noise because the process for detecting a photon is a kind of random process that follows a Poisson distribution. The MOS device noise is noise due to the transistors of the pixel, and appears as thermal noise, flicker noise, etc.

The number of transistors that can be included in a pixel is 3 or 4. The source follower transistor is the most sensitive to noise. The reset transistor just resets the potential of the sensing node so that the sensing node has substantially a level of a predetermined power supply voltage, and the transmission transistor just transmits the charges stored in the photo diode to the sensing node. In addition, the source follower transistor receives the voltage of the sensing node to amplify the voltage of the sensing node, and transmits the amplified voltage of the sensing node to the internal circuit. The noise induced at the source follower transistor is directly transmitted to the internal circuit, thereby deteriorating image quality. Thus, it is important to reduce the thermal noise and the flicker noise that can be induced at the source follower transistor.

The thermal noise and the flicker noise are respectively represented by expressions 2 and 3.

$$(\text{thermal noise})^2 \approx 4 \times k \times T \times R, \qquad <\text{Expression 2}>$$

(k=Boltzmann constant=$1.38 \times 10^{-23}$ J/K, T=absolute temperature, R=resistance, wherein R is proportional to a channel length of a MOS transistor and is inversely proportional to a channel width of MOS transistor)

$$(\text{flickers noise})^2 \approx \frac{K}{C_{ox} \times W \times L} \times \frac{1}{f} \qquad <\text{Expression 3}>$$

(K=process constant, $C_{ox}$=capacitance of gate oxide per unit area, W=channel width of MOS transistor, L=channel length of MOS transistor, f=operating frequency)

As shown in the expressions 2 and 3, the thermal noise and the flicker noise of the MOS device decrease accordingly as the channel width of the transistor increases. In addition, the pixel size cannot be reduced further while the channel width of the transistor is maintained to have a width wider than a predetermined width. In particular, since the CMOS active pixel sensor has to increase the channel width of the transistor at the same time to maintain the optically symmetric structure, it is impossible to reduce the pixel size.

Figure 3:
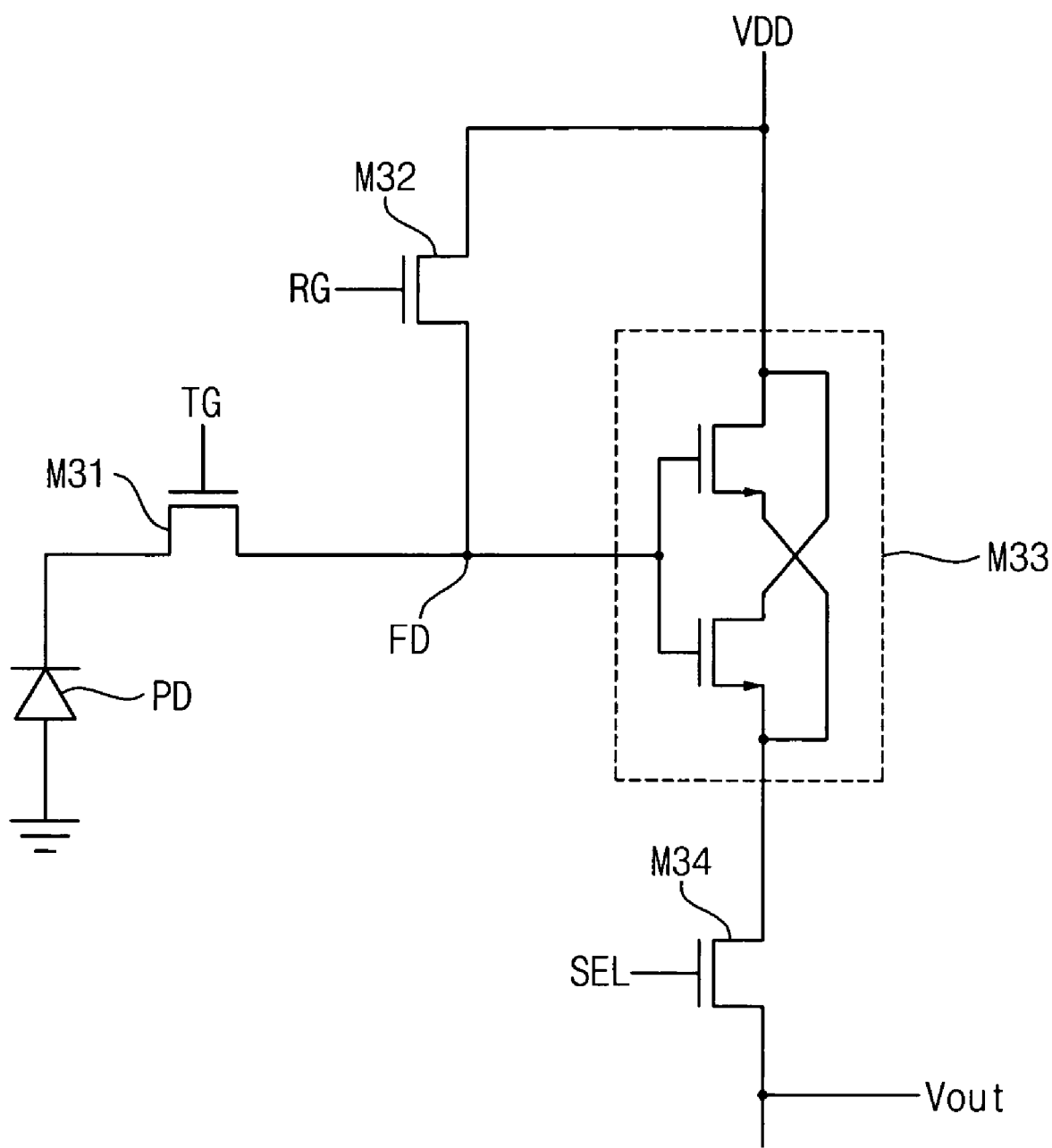
FIG. 3 is a circuit diagram illustrating a CMOS active pixel sensor having a 4-transistor configuration using a fingered type source follower transistor according to an example embodiment of the present disclosure.

FIG. 3 is a circuit diagram illustrating a CMOS active pixel sensor having a 4-transistor configuration using a fingered type source follower transistor. Referring to FIG. 3, in the CMOS active pixel sensor 300 having the 4-transistor configuration using a fingered type source follower transistor, the fingered type (or folding-gate type) source follower transistor M33 replaces the source follower transistor M13 of the CMOS active pixel sensor 100 having the 4-transistor configuration shown in FIG. 1. The operation of the CMOS active pixel sensor 300 having the 4-transistor configuration shown in FIG. 3 may be like that of the CMOS active pixel sensor 100 having the 4-transistor configuration shown in FIG. 1. In addition, the source follower transistor M33, which is the most sensitive to noise among the transistors of one pixel, has the fingered type transistor, so that the effect of various types of the intrinsic noise of the transistor, such as the thermal noise and the flicker noise, may be reduced.

Figure 4:
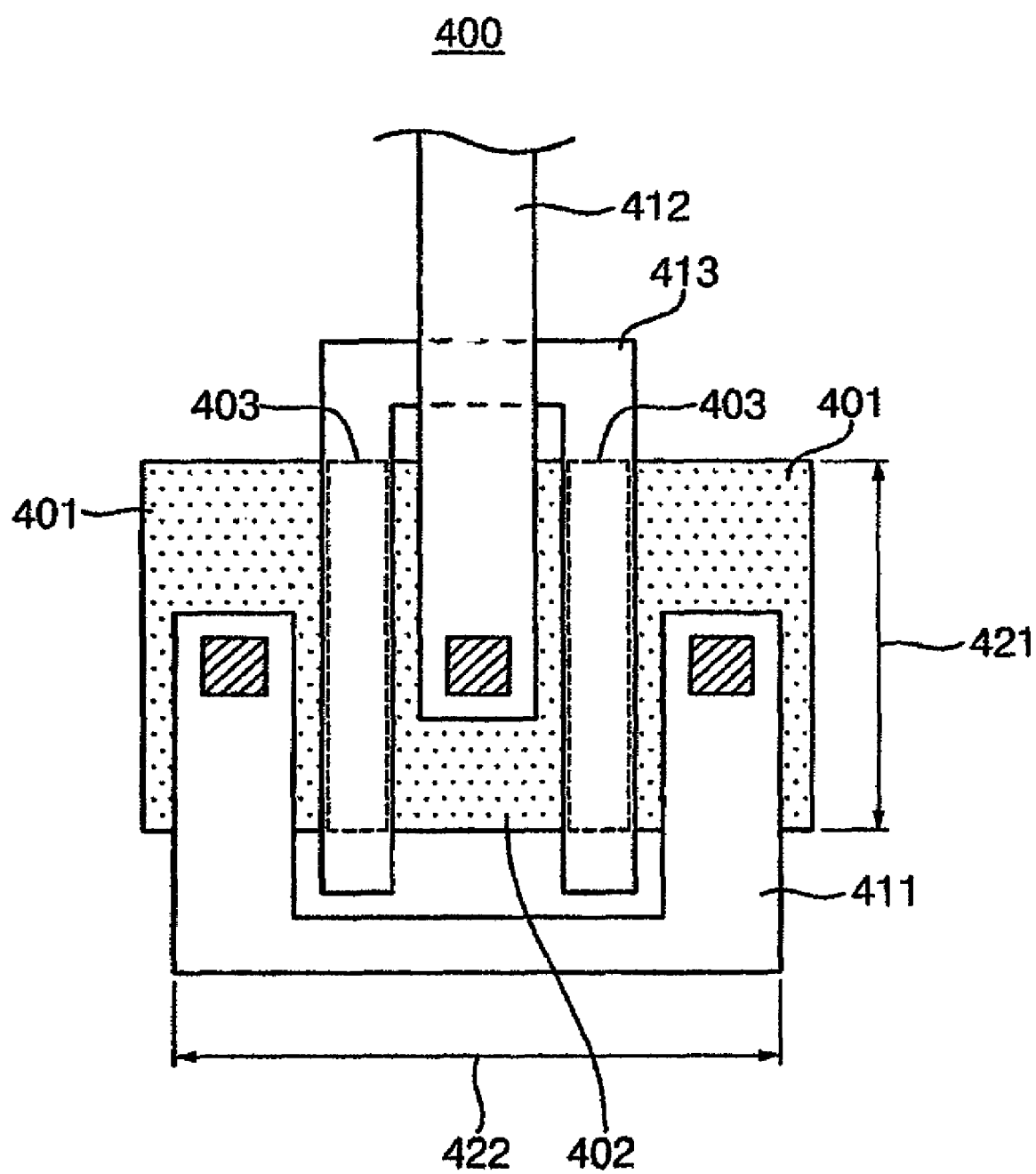
FIG. 4 is a plane view illustrating a fingered type transistor that can be used as a source follower transistor of a CMOS active pixel sensor according to an example embodiment of the present disclosure.

The advantage of the CMOS active pixel sensor 300 having the 4-transistor configuration using a fingered type source follower transistor will be explained with reference to FIG. 4. FIG. 4 is a plane view illustrating a fingered type transistor that can be used as a source follower transistor of a CMOS active pixel sensor according to an exemplary embodiment of the present disclosure.

Referring to FIG. 4, the fingered type transistor 400 includes two source regions 401, a drain region 402 shared by the two source regions 401, and two gate regions 403. The two source regions 401, the drain region 402 and the two gate regions 403 are coupled to external sources via electrodes 411, 412 and 413, respectively.

The fingered type transistor 400 has two gate regions 403 arranged in the horizontal direction 422, instead of a width of the fingered type transistor 400 being increased in the longitudinal direction 421, so that the channel width of the fingered type transistor 400 is increased by two times while the width of the fingered type transistor 400 is not increased in the longitudinal direction 421. Thus, even when there are constraints in that the width 421 of the fingered type transistor 400 cannot be increased beyond a predetermined width, so as to maintain the optical symmetric structure of the CMOS active pixel sensor 400, a layout degree of freedom for implementing the wide channel length of the fingered type transistor may be increased.

In addition, the resistance of the gate electrode of the fingered type transistor 400 decreases compared with a single type transistor because of the folding of the gate electrode of the fingered type transistor. When the fingered type transistor 400 is used as the source follower transistor, the low resistance of the gate electrode of the fingered type transistor 400 may faithfully sense the voltage of the sensing node, i.e., the voltage of the floating diffusion node FD.

The fingered type transistor 400 may be implemented by an N type transistor of which source region 401 and drain region 402 are N type. Alternatively, the fingered type transistor 400 may be implemented by a P type transistor of which source region 401 and drain region 402 are P type.

Figure 5:
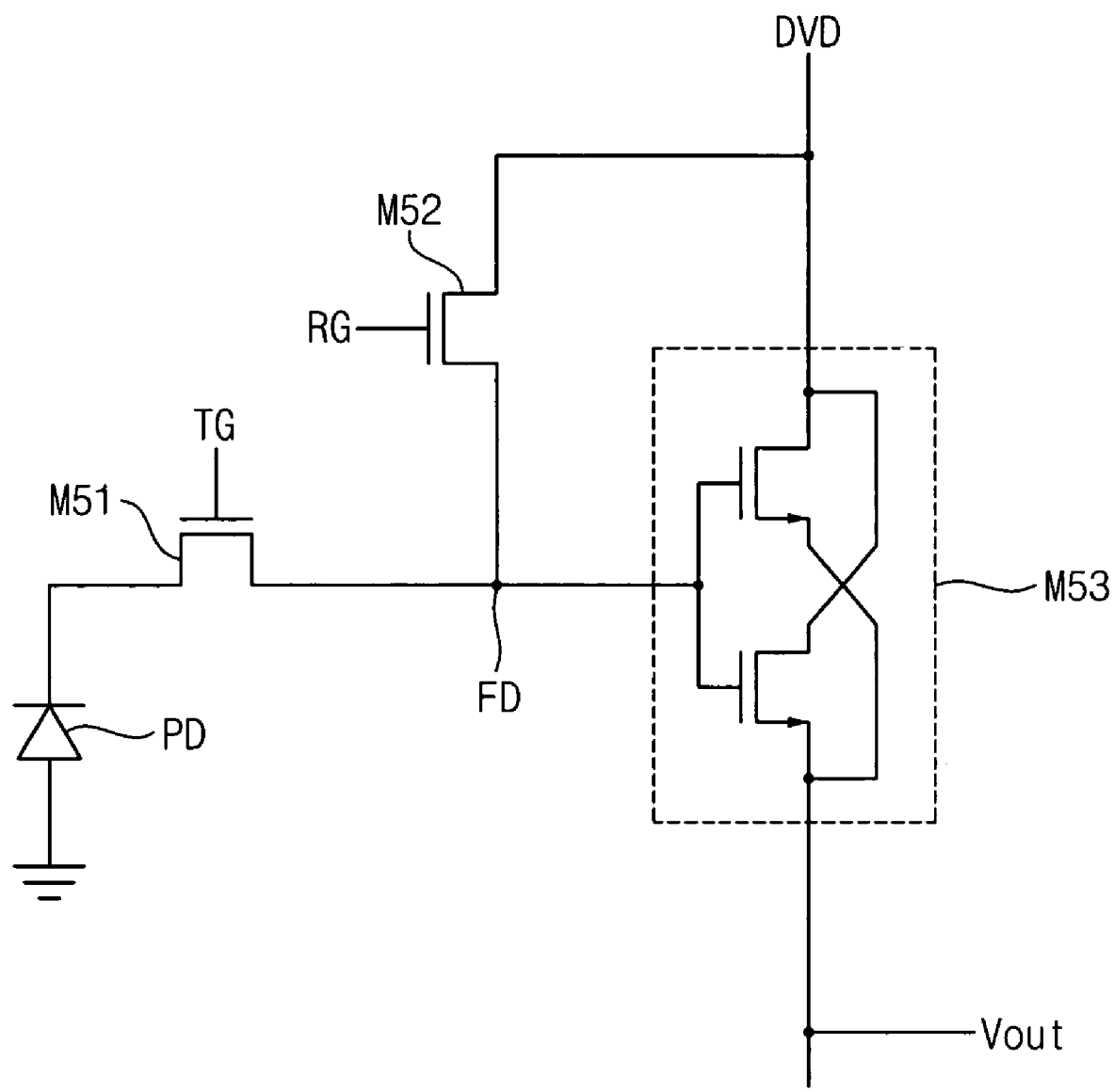
FIG. 5 is a circuit diagram illustrating a CMOS active pixel sensor having a 3-transistor configuration using a fingered type source follower transistor according to an example embodiment of the present disclosure.

FIG. 5 is a circuit diagram illustrating a CMOS active pixel sensor having a 3-transistor configuration using a fingered type source follower transistor. Referring to FIG. 5, in the CMOS active-pixel sensor 500 having the 3-transistor configuration using a fingered type source follower transistor, the fingered type source follower transistor M53 replaces the source follower transistor M23 of the CMOS active pixel sensor 200 having the 3-transistor configuration shown in FIG. 2.

The CMOS active pixel sensor 500 having the 3-transistor configuration does not have the selection transistor, but the dynamic power supply voltage DVD replaces the function of the selection transistor. In addition, the CMOS active pixel sensor 500 having the 3-transistor configuration may omit the transmission transistor M31 of FIG. 3 instead of the selection transistor.

Figure 2:
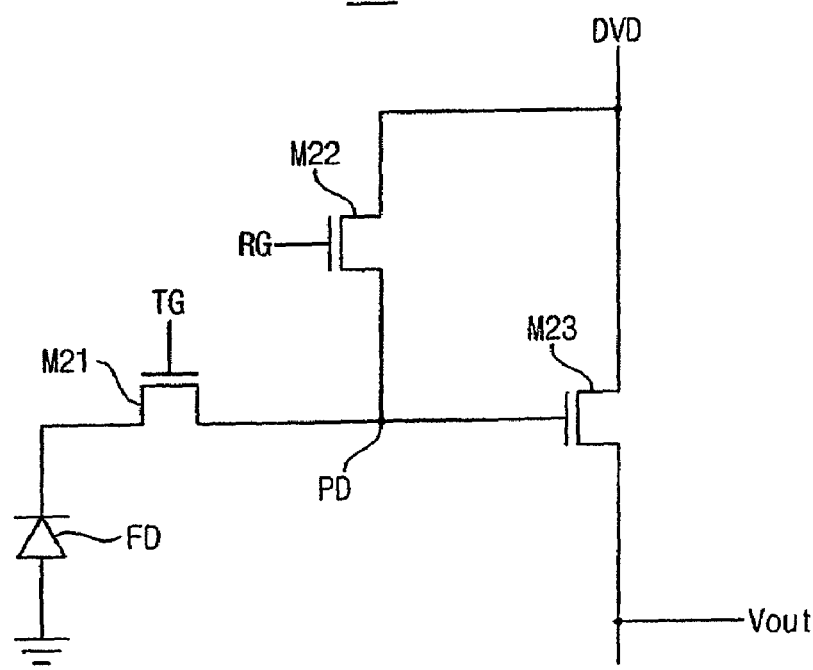
FIG. 2 is a circuit diagram illustrating a conventional CMOS active pixel sensor having a 3-transistor configuration.

The operation of the CMOS active pixel sensor 500 having the 3-transistor configuration shown in FIG. 5 may be like that of the CMOS active pixel sensor 200 having the 3-transistor configuration shown in FIG. 2. In addition, the source follower transistor M33, which is the most sensitive to noise among the transistors of one pixel, has the fingered type transistor, so that the effect of various types of the intrinsic noise of the transistor, such as the thermal noise and the flicker noise, may be reduced.

Not only the CMOS active pixel sensor 500 having the 3-transistor configuration shown in FIG. 5 and the CMOS active pixel sensor 300 having the 4-transistor configuration shown in FIG. 3, but also other configurations of CMOS active pixel sensors may replace a source follower transistor with the fingered type transistor so as to reduce the effect of the device noise. For example, one of the modifications in the configuration is that the selection transistor M34 of the CMOS active pixel sensor 300 having the 4-transistor configuration shown in FIG. 3 may be coupled between the source follower transistor M33 and the power supply voltage VDD. Thus, the above modification of the configuration may increase the effectiveness of the metal lines, may increase the channel length of the transistor, and the device noise may be reduced.

In addition, the replacement of the source follower transistor with the fingered type transistor may be accomplished by changing a metal routing of the conventional layout of the active pixel sensor. Thus, the compatibility of manufacturing process may be increased.

For example, the CMOS active pixel sensor 100 having the 4-transistor configuration may be easily changed into the CMOS active pixel sensor 500 having the 3-transistor configuration using the fingered type source follower transistor by only changing the metal line.

Figure 6A:
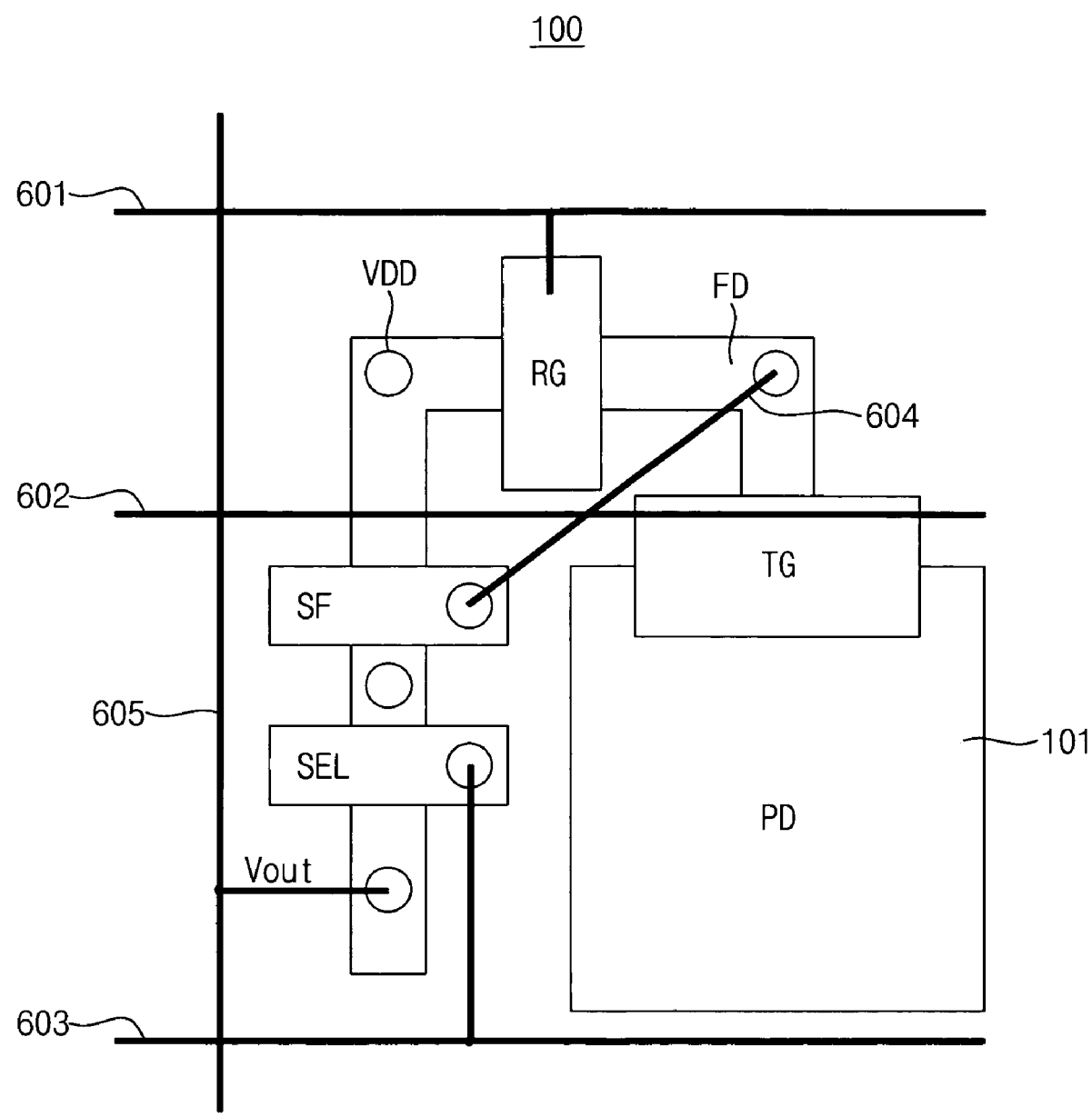
FIG. 6A is a plane view illustrating the conventional CMOS active pixel sensor having the 4-transistor configuration of FIG. 1 that is implemented on a silicon substrate.
Figure 6B:
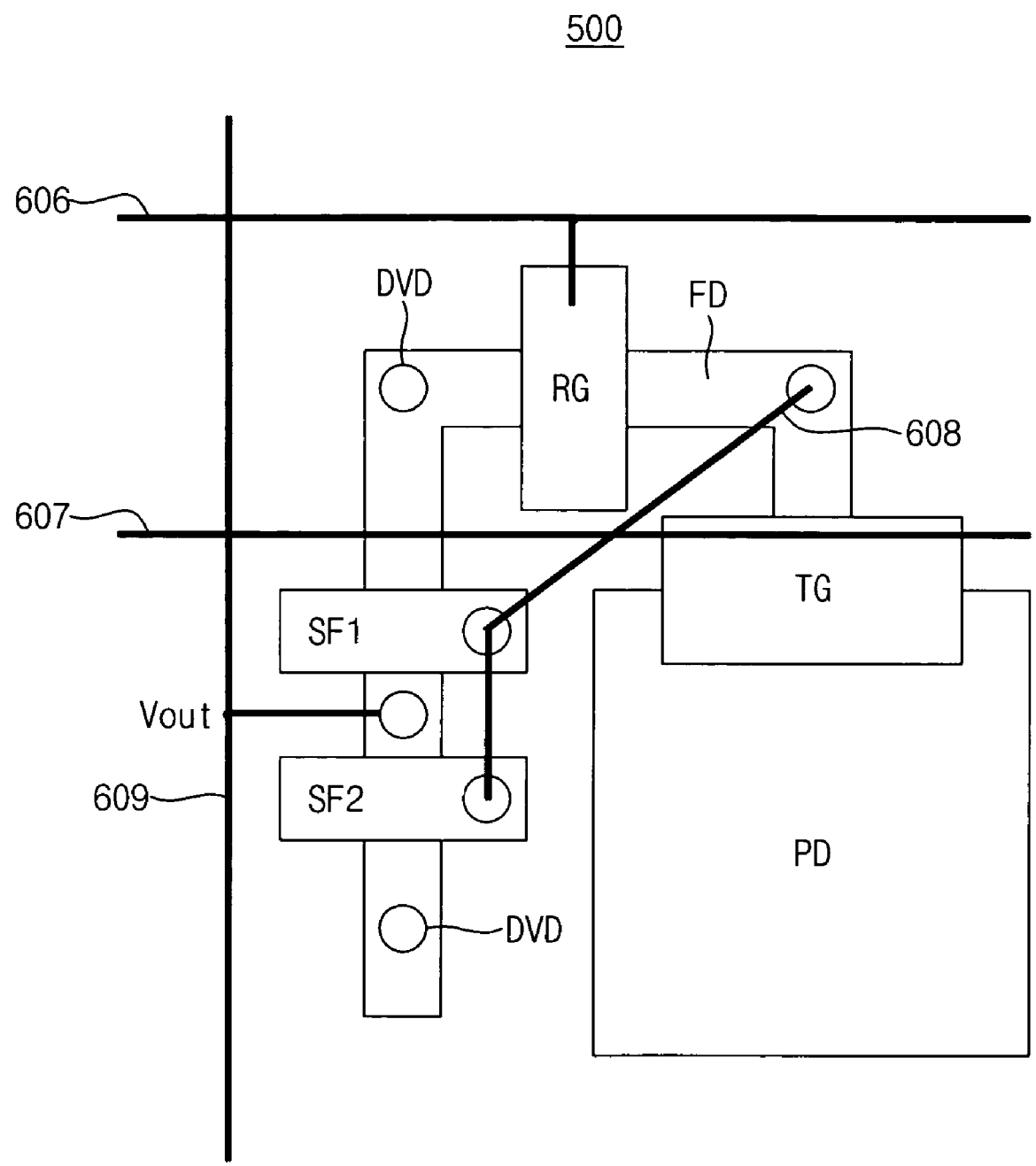
FIG. 6B is a plane view illustrating the CMOS active pixel sensor having the 3-transistor configuration of FIG. 5 using the fingered type source follower transistor that is implemented on a silicon substrate according to an example embodiment of the present disclosure.

FIGS. 6A and 6B are plane views illustrating that the conventional CMOS active pixel sensor having the 4-transistor configuration may be easily changed into the CMOS active pixel sensor having the 3-transistor configuration using the fingered type source follower transistor.

FIG. 6A is a plane view illustrating the CMOS active pixel sensor having the 4-transistor configuration 100 of FIG. 1 that is implemented on a silicon substrate. Referring to FIG. 6A, a connecting line 604 between the floating diffusion node FD and a gate SF of the source follower transistor, and an output line (VOUT) 605 of the selection transistor are formed on a second metal line.

FIG. 6B is a plane view illustrating the CMOS active pixel sensor having the 3-transistor configuration 500 of FIG. 5 using the fingered type source follower transistor that is implemented on a silicon substrate. Referring to is FIG. 6B, a control line 606 of a gate RG of the reset transistor and a control line 607 of a gate TG of the transmission transistor are formed on a first metal line. A connecting line 608 between the floating diffusion node FD, first gate SF1 and second gate SF2 of the source follower transistor, and an output line (VOUT) 609 of the source follower transistor are formed on a second metal line.

The active pixel sensor 500 of FIG. 6B replaces the gate SF of the source follower transistor and the gate SEL of the selection transistor of the active pixel sensor in FIG. 6A with the first gate SF1 and the second gate SF2 of the fingered type source follower transistor. Thus, the conventional active pixel sensor 100 having the 4-transistor configuration may be changed to the active pixel sensor 500 having the 3-transistor configuration according to an exemplary embodiment of the present disclosure by only changing a metal routing of the second metal line of the conventional active pixel sensor 100 having the 4-transistor configuration. Thus, the compatibility of a manufacturing process may be increased.

The method, which is shown with respect to FIGS. 6A and 6B, of forming the active pixel sensor 500 having the 3-transistor configuration according to an exemplary embodiment of the present disclosure shows only an example of a method of forming the active pixel sensor 500 such that a manufacturing process is compatible with that of the conventional active pixel sensor 100 having the 4-transistor configuration.

Figure 7:
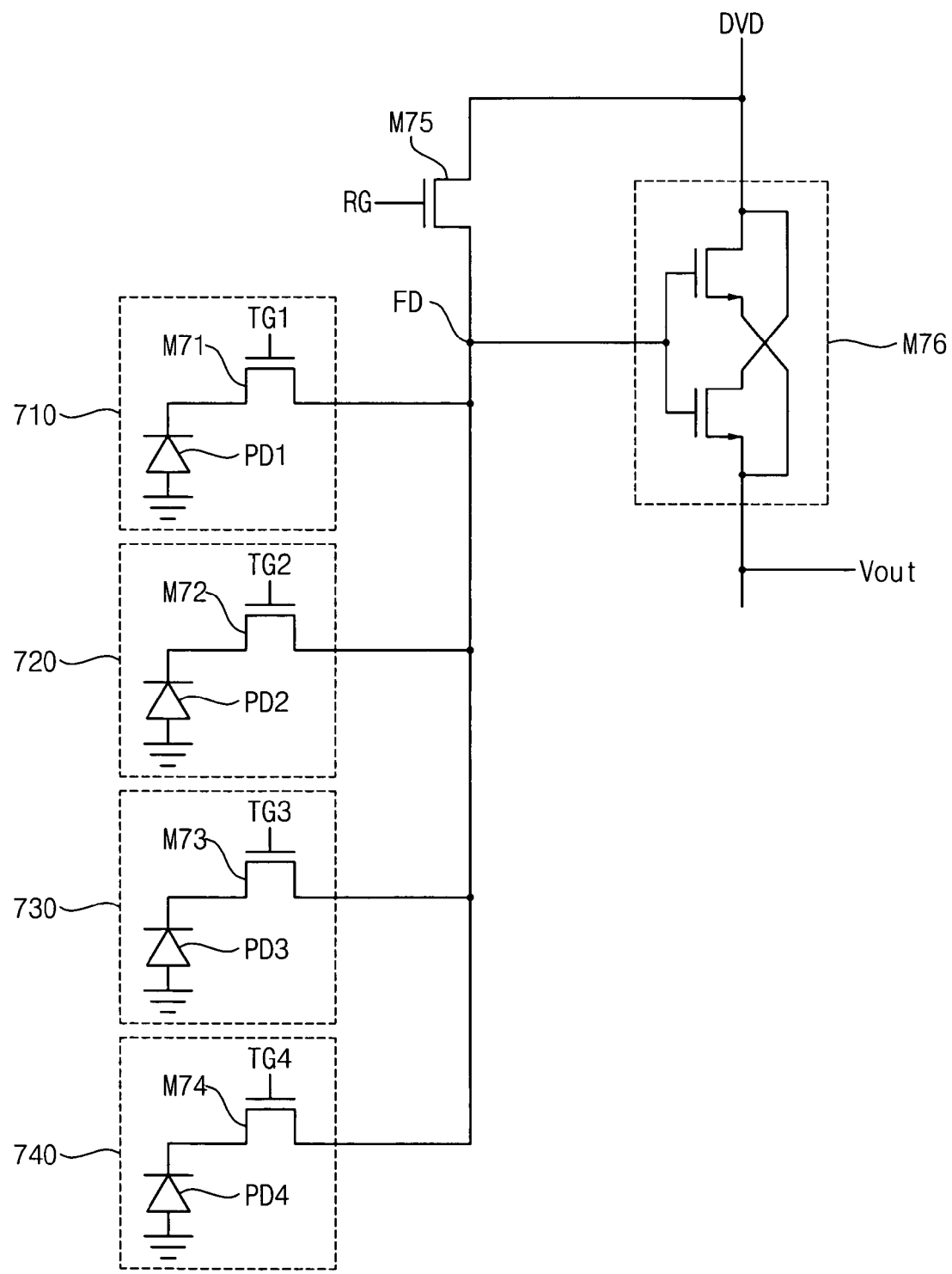
FIG. 7 is a circuit diagram illustrating an active pixel sensor array having a shared structure according to an example embodiment of the present disclosure.

FIG. 7 is a circuit diagram illustrating an active pixel sensor array having a shared structure according to an exemplary embodiment of the present disclosure. Referring to FIG. 7, the pixel sensor array 700 having a shared structure may enhance a pixel fill factor. The pixel fill factor is defined as a ratio of an area occupied by photo diodes to another area occupied by reset transistors and other transistors that sense signals.

Referring to FIG. 7, the pixel array 700 having the active pixel sensor includes a plurality of pixels. For example, FIG. 7 shows four pixels 710, 720, 730 and 740 that share one reset transistor M75 and one source follower transistor M76. The pixel array 700 of FIG. 7 shows a modification of the active pixel sensor 500 having the 3-transistor configuration of FIG. 5. In the same manner as above, the active pixel sensor 300 having the 4-transistor configuration in FIG. 3 may have the active pixel sensor array having the shared configuration as shown in FIG. 7.

Referring to FIG. 7, the active pixel sensor array 700 includes four pixels 710, 720, 730 and 740 respectively having a photo diode and a transmission transistor. A first pixel 710 includes a photo diode PD1 and a transmission transistor M71. In the same manner, the second pixel 720, the third pixel 730 and the fourth pixel 740 have the same configuration as in the first pixel 710.

The photo diodes PD1, PD2, PD3 and PD4 and the transmission transistors M71, M72, M73 and M74 included in the pixels 710, 720, 730 and 740, respectively, of the active pixel sensor array 700 share a reset transistor M75 and a source follower transistor M76. In addition, the pixels 710, 720, 730 and 740 share a floating diffusion node FD.

Thus, the transmission transistors M71, M72, M73 and M74 included in the pixels 710, 720, 730 and 740 of the active pixel sensor array 700 sequentially transmit photons integrated in the corresponding photo diodes PD1, PD2, PD3 and PD4 to the floating diffusion node FD. The fingered type source follower transistor samples the voltage of the floating diffusion node FD to output the sample voltage as an output voltage VOUT to an internal circuit.

In addition, a conventional active pixel sensor array having a shared structure may be changed into the fingered type source follower active pixel sensor array having the shared structure by changing a metal routing while the compatibility of a manufacturing process may be increased.

For example, the conventional active pixel sensor array having a 2-pixel shared structure and a 3-transistor configuration may be easily changed into the fingered type source follower active pixel sensor array having a 4-pixel shared structure and a 4-transistor configuration by only changing the metal routing.

FIGS. 8A, 8B, 9A and 9B are plane views and circuit diagrams illustrating how the conventional active pixel sensor array having the 2-pixel shared structure and the 3-transistor configuration may be easily changed into the fingered type source follower active pixel sensor array having the 4-pixel shared structure and the 4-transistor configuration.

Figure 8A:
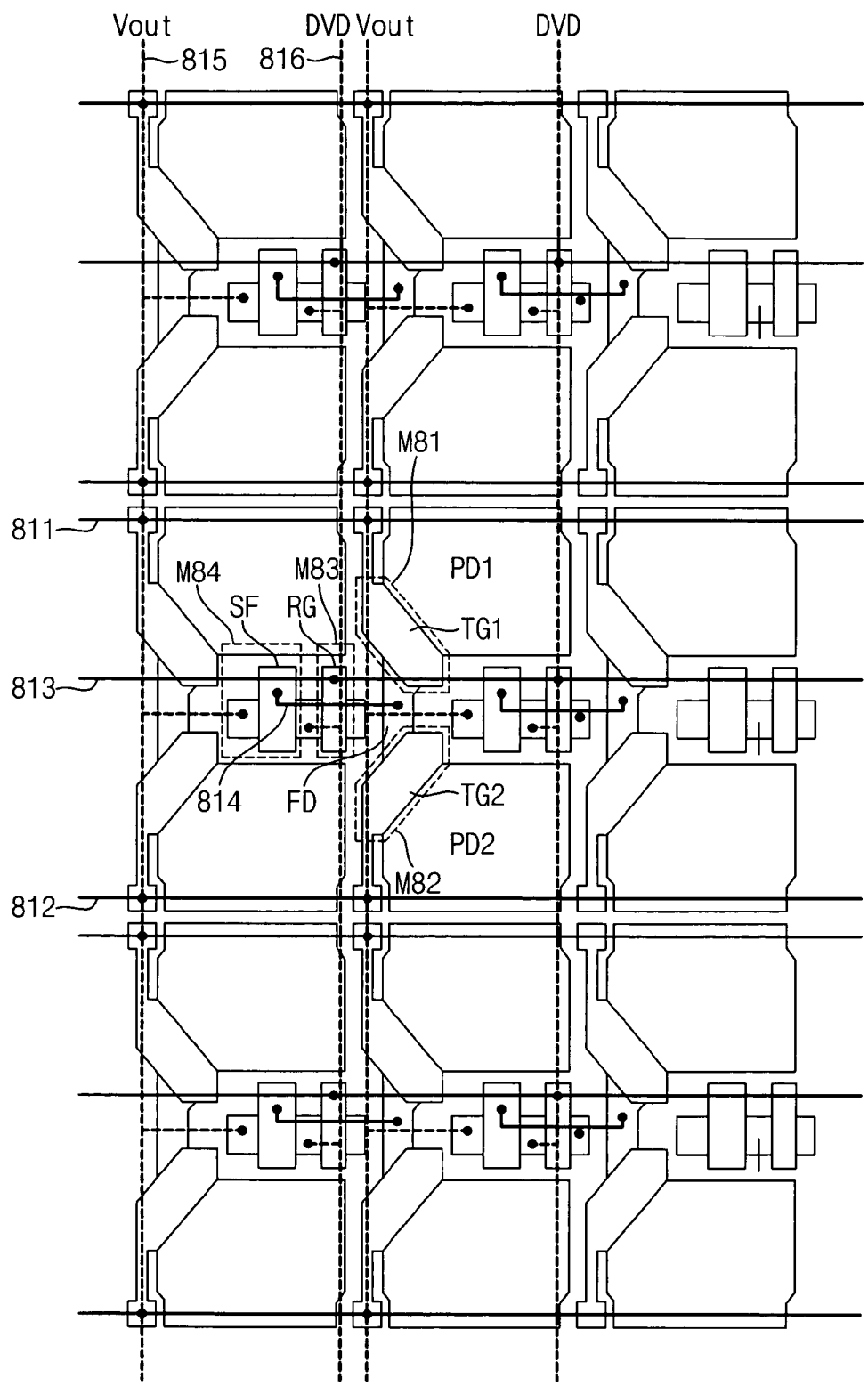
FIG. 8A is a plane view illustrating a conventional active pixel sensor array having a 2-pixel shared structure and a 3-transistor configuration.

FIG. 8A is a plan view illustrating the conventional active pixel sensor array having the 2-pixel shared structure and the 3-transistor configuration. Referring to FIG. 8A, the conventional active pixel sensor array 800 having the 2-pixel shared structure and the 3-transistor configuration includes two photo diode regions PD1 and PD2, transmission transistors M81 and M82 respectively corresponding to the photo diode regions PD1 and PD2, a floating diffusion node FD shared by the two photo diode regions PD1 and PD2, a reset transistor M83 for resetting the voltage of the floating diffusion node FD, and a source follower transistor M84 that samples the voltage of the floating diffusion node FD to output the sampled voltage to the internal circuit.

A control line 811 for controlling a gate TG1 of a first transmission transistor M81 corresponding to the first photo diode region PD1, and a control line 812 for controlling a gate TG2 of a second transmission transistor M82 corresponding to the second photo diode region PD2 may be formed on a first metal line. Further, a control line 813 for controlling a gate RG of the reset transistor M83 may be formed on the first metal line. A connecting line 814 for connecting a gate SF of the source follower transistor, a floating diffusion node FD and an end of the reset transistor may be formed on the first metal line.

In addition, a power supply line 816 for supplying a dynamic power supply voltage DVD to an end of the source follower transistor and an end of the reset transistor, and an output voltage line (VOUT) 815 for transmitting the source voltage of the source follower transistor to the internal circuit may be formed on a second metal line.

The metal lines 811 through 816 do not pass over the photo diode regions PD1 and PD2 so as to minimize the shielding of the photo diode regions PD1 and PD2 by the metal lines, so that the photo diode regions PD1 and PD2 exposure to light may be increased. Even when portions of the metal line are formed over the photo diodes, the portions of the metal line may be formed over the photo diodes so as to shield the same areas and symmetrical portions of each of the photo diodes.

Figure 8B:
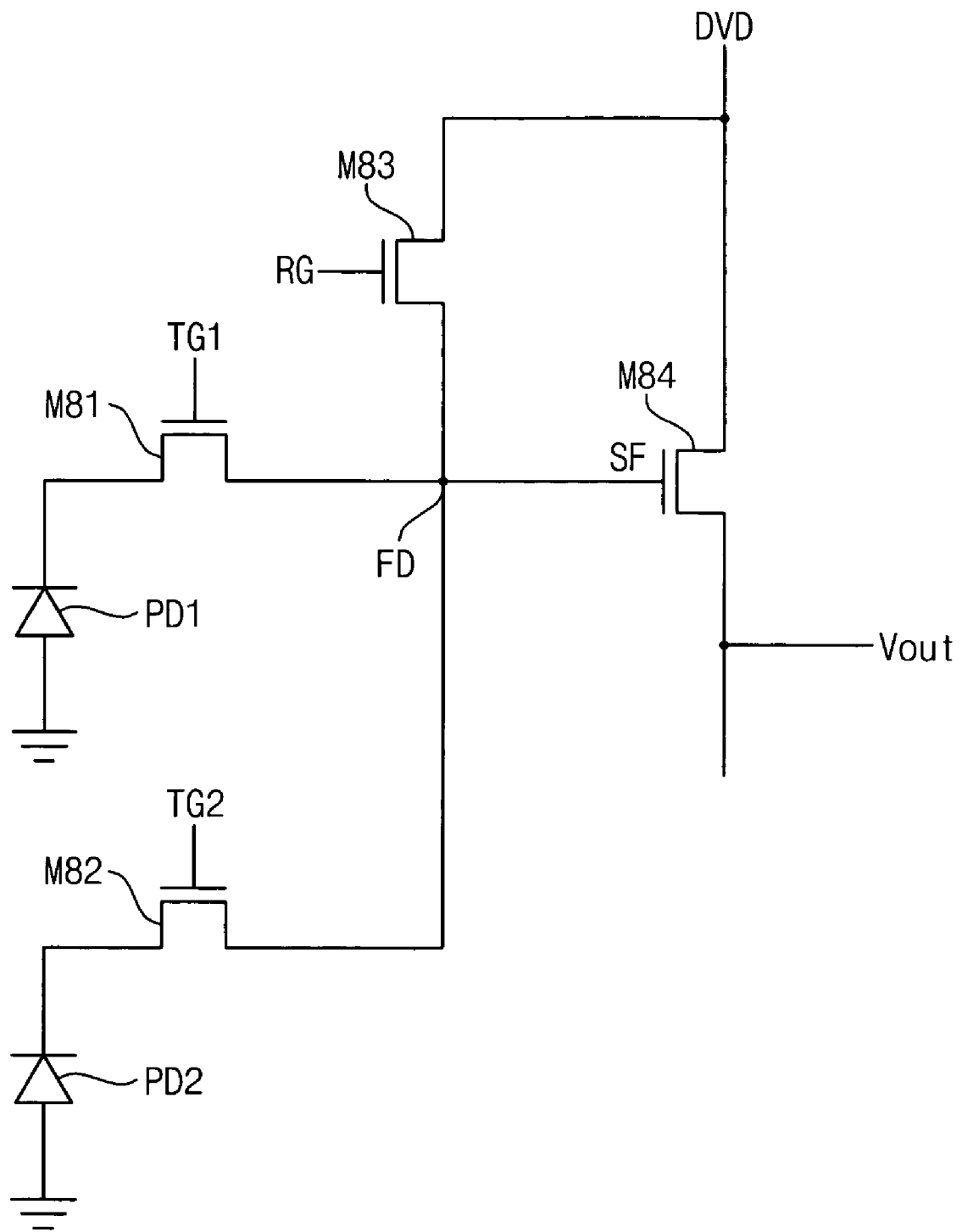
FIG. 8B is a circuit diagram illustrating the conventional active pixel sensor array having the 2-pixel shared structure and the 3-transistor configuration of FIG. 8A.

FIG. 8B is a circuit diagram illustrating the conventional active pixel sensor array having the 2-pixel shared structure and the 3-transistor configuration of FIG. 8A. Referring to FIG. 8B, the active pixel sensor array has the 2-pixel shared structure, which is a modification of the conventional active pixel sensor 200 of FIG. 2 having the 3-transistor configuration. The same reference numerals in FIG. 8A will be used to refer to the same elements in FIG. 8B.

In the active pixel sensor array of FIG. 8B, two photo diodes PD1 and PD2, and transmission transistors M81 and M82 respectively corresponding to the photo diodes PD1 and PD2 share a reset transistor M83 and a source follower transistor M84.

The operation of the active pixel sensor array of FIG. 8B is similar to the operation of the active pixel sensor of FIG. 2 having the 3-transistor configuration. While the dynamic power supply voltage DVD is increased to a high power supply voltage, the potential of the floating diffusion node FD is reset by the reset transistor M83 so that the floating diffusion node FD has a high power supply voltage.

When the dynamic power supply voltage DVD has a low power supply voltage, the first transmission transistor M81 is turned on, so that the photons integrated in the first photo diode PD1 corresponding to the first transmission transistor M81 are transmitted to the floating diffusion node FD. Then, while the dynamic power supply voltage DVD is increased to the high power supply voltage, the voltage of the floating diffusion node FD is sampled by the source follower transistor M84 and the sampled voltage is outputted as an output voltage Vout to an internal circuit. The same operation as the above operation is performed on the second photo diode region PD2 and the second transmission transistor M82.

Figure 9A:
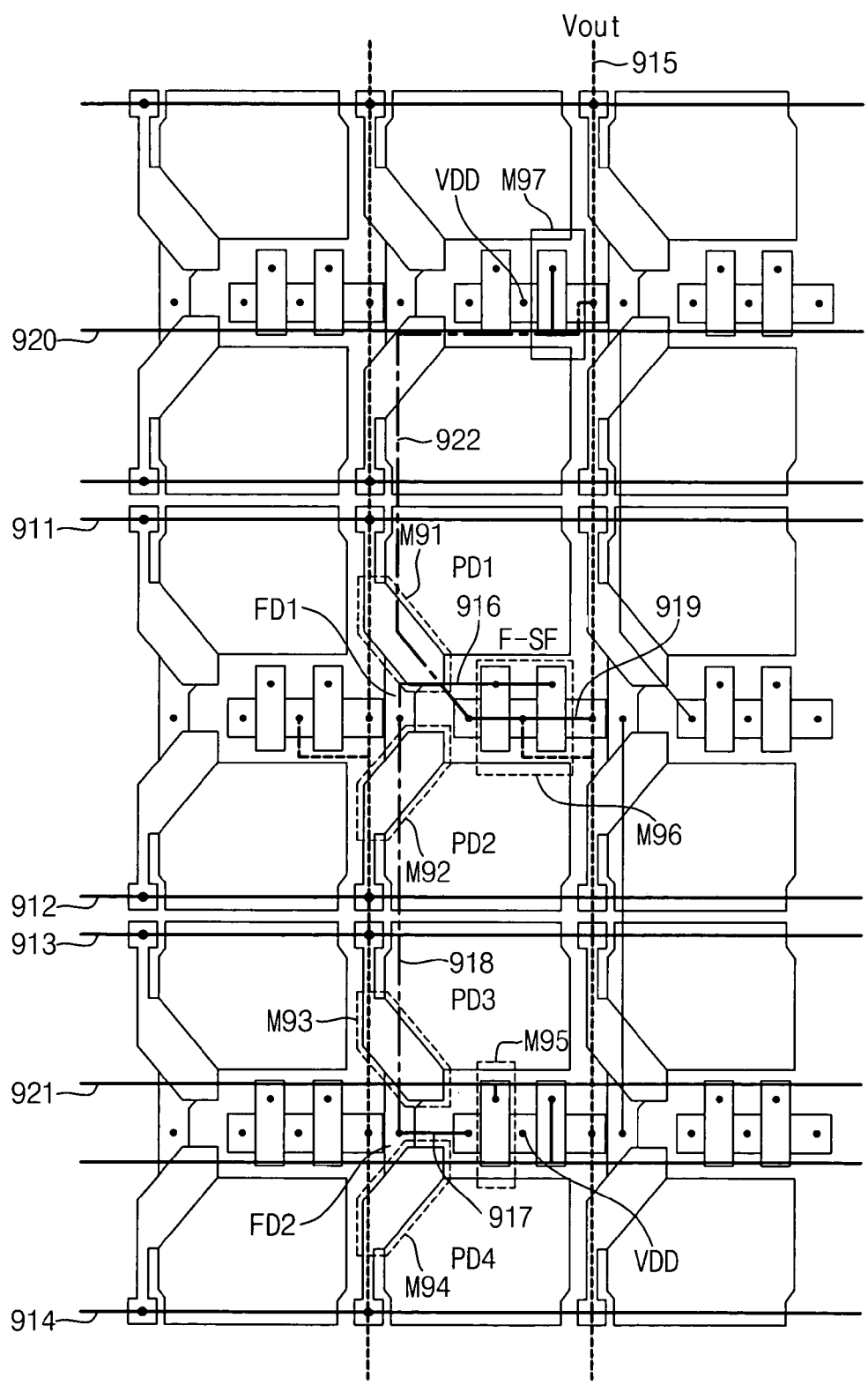
FIG. 9A is a plane view illustrating an active pixel sensor array having a 4-pixel shared structure and a 4-transistor configuration according to an example embodiment of the present disclosure.

FIG. 9A is a plane view illustrating the active pixel sensor array having the 4-pixel shared structure and the 4-transistor configuration. FIG. 9A shows that the conventional active pixel sensor array 800 having the 2-pixel shared structure and the 3-transistor configuration is able to be changed into the active pixel sensor array 900 having the 4-pixel shared structure and the 4-transistor configuration by only changing the metal line.

Referring to FIG. 9A, the active pixel sensor array 900 having the 4-pixel shared structure and the 4-transistor configuration includes four photo diode regions PD1, PD2, PD3 and PD4, and transmission transistors M91, M92, M93 and M94 respectively corresponding to the photo diode regions PD1, PD2, PD3 and PD4. The first and the second photo diode regions PD1 and PD2 share the first floating diffusion node FD1, and the third and the fourth photo diode regions PD3 and PD4 share the second floating diffusion node FD2. The first floating diffusion node FD1 is electrically connected to the second floating diffusion node FD2 via the metal line 918, so that the first and second floating diffusion nodes FD1 and FD2 have the same potential.

In addition, the active pixel sensor array 900 having the 4-pixel shared structure and the 4-transistor configuration further includes a reset transistor M95 for resetting the voltage of the floating diffusion nodes FD1 and FD2, a source follower transistor M96 that samples the voltage of the floating diffusion nodes FD1 and FD2, and a selection transistor M97 that outputs the source voltage of the source follower transistor to the internal circuit. The source follower transistor may be fingered type transistor.

Figure 9B:
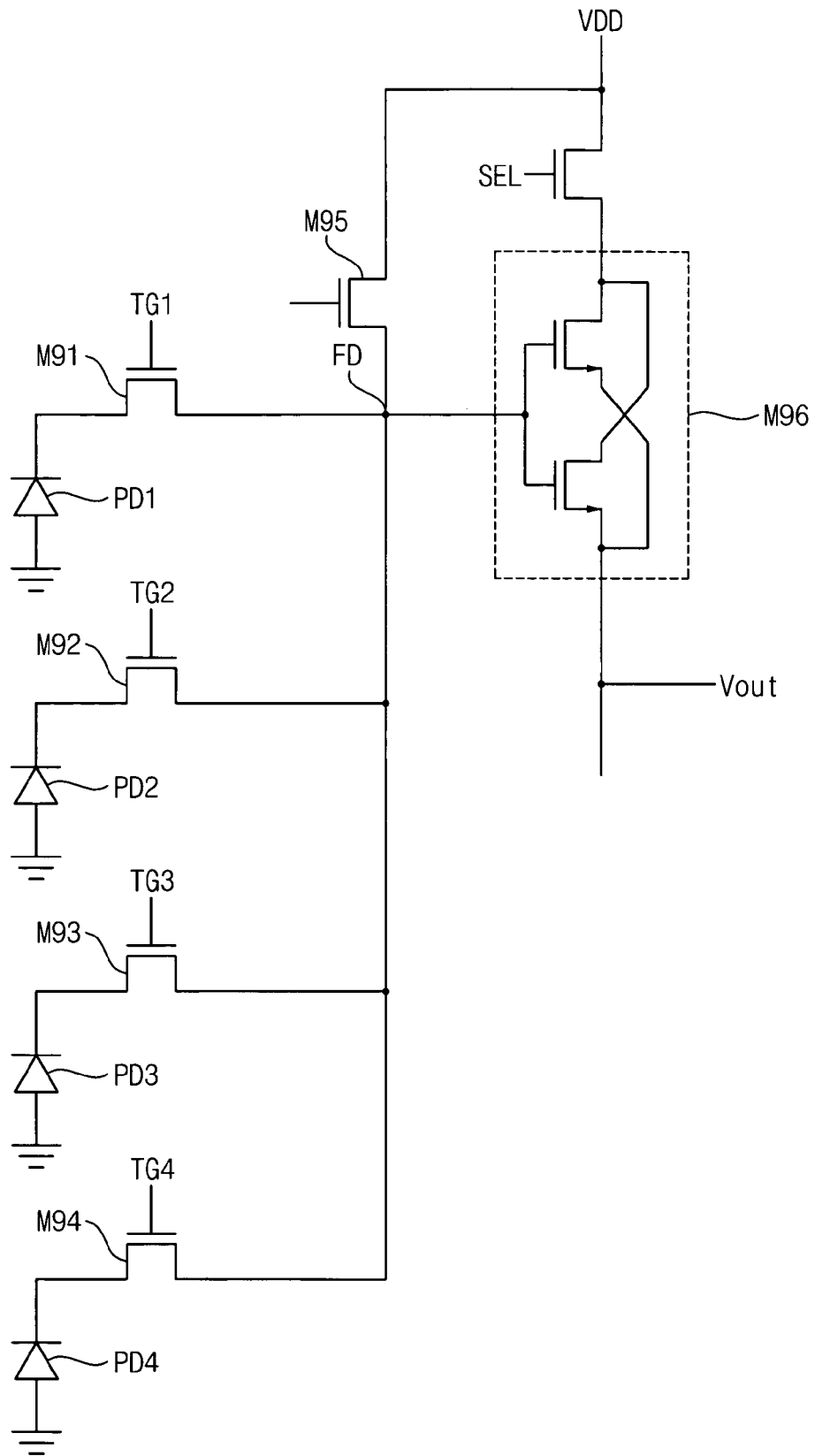
FIG. 9B is a circuit diagram illustrating the active pixel sensor array having the 4-pixel shared structure and the 4-transistor configuration of FIG. 9A according to an example embodiment of the present disclosure.

Referring to FIG. 9A, the active pixel sensor array 900 having the 4-pixel shared structure and the 4-transistor configuration is different from the active pixel sensor 300 of FIG. 3, in that the selection transistor M97 is coupled between the source follower transistor M96 and the power supply voltage VDD (refer to FIG. 9B). The effectiveness of the metal lines and the channel length of the transistor may be increased, and the device noise may be reduced depending upon the layout of the active pixel sensor implemented on the silicon substrate.

In FIG. 9A, a control line 911 for controlling a gate TG1 of a first transmission transistor M91 corresponding to the first photo diode region PD1, and a control line 912 for controlling a gate TG2 of a second transmission transistor M92 corresponding to the second photo diode region PD2 may be formed on a first metal line. Further, a control line 913 for controlling a gate TG3 of a third transmission transistor M93 corresponding to the third photo diode region PD3, and a control line 914 for controlling a gate TG4 of a fourth transmission transistor M94 corresponding to the fourth photo diode region PD4 may be also formed on the first metal line.

Further, a control line 921 for controlling a gate voltage RG of the reset transistor M95 may be formed on the first metal line. A control line 920 for controlling a gate voltage SEL of the selection transistor M97 may be also formed on the first metal line.

A connecting line 916 for connecting gates of the source follower transistors M96 and the floating diffusion node FD may be formed on the first metal line. A connecting line 919 for connecting drains of the source follower transistors M96 may also be formed on the first metal line.

A connecting line 917 for connecting an end of the reset transistor M95 and the floating diffusion node FD may be formed from the first metal line. A connecting line 918 for connecting the first floating diffusion node FD1, which is shared by the first and the second photo diode regions PD1 and PD2, and the second floating diffusion node FD2, which is shared by the third and the fourth photo diode regions PD3 and PD4 may be formed from the second metal line. A connecting line 922 for connecting the selection transistor M97 and drains of the source follower transistors M96 may be formed from the second metal line. An output voltage line (VOUT) 915 for outputting the source voltage of the source follower transistor M96 to the internal circuit may be formed from a third metal line.

Thus, the conventional active pixel sensor array having the 2-pixel shared structure and the 3-transistor configuration of FIG. 8A may be easily changed into the active pixel sensor array having the 4-pixel shared structure and the 4-transistor configuration of FIG. 9A by only changing the metal routing.

FIG. 9B is a circuit diagram illustrating the active pixel sensor array having the 4-pixel shared structure and the 4-transistor configuration of FIG. 9A. In the active pixel sensor array of FIG. 9B, four photo diodes PD1, PD2, PD3 and PD4, and transmission transistors M91, M92, M93 and M94 respectively corresponding to the photo diodes PD1, PD2, PD3 and PD4 share a reset transistor M95, a source follower transistor M96 and a selection transistor M97.

In addition, the four photo diodes PD1, PD2, PD3 and PD4, and the transmission transistors M91, M92, M93 and M94 share a floating diffusion node FD. The layout of the active pixel sensor array of FIG. 9A shows the first and the second floating diffusion nodes FD1 and FD2 separately; in addition, the first floating diffusion node FD1 is electrically connected to the second floating diffusion node FD2 via the metal line 918, so that the first and second floating diffusion nodes FD1 and FD2 have the same potential. Thus, in FIG. 9B, one floating diffusion node FD represents the first and the second floating diffusion nodes FD1 and FD2.

The operation of the active pixel sensor array of FIG. 9B is similar to the operation of the active pixel sensor of FIG. 3 having the 3-transistor configuration. The active pixel sensor array having the 4-pixel shared structure of FIG. 9B is different from the active pixel sensor 300 having the 4-transistor configuration of FIG. 3, in that the selection transistor M97 is coupled between the source follower transistor M96 and the power supply voltage VDD. The potential of the floating diffusion node FD is reset by the reset transistor M95 so that the floating diffusion node FD has the power supply voltage VDD. The first transmission transistor M91 is turned on, so that the photons integrated in the first photo diode PD1 corresponding to the first transmission transistor M91 are transmitted to the floating diffusion node FD. Then, when the selection transistor M97 is turned on so that the power supply voltage VDD is electrically connected to the drains of the source follower transistor M96, the voltage of the floating diffusion node FD is sampled by the source follower transistor M96 and the sampled voltage is outputted as an output voltage Vout to an internal circuit.

The same operation as the above operation is performed on the second photo diode region PD2, the second transmission transistor M92, the third photo diode region PD3, the third transmission transistor M93, the fourth photo diode region PD4, and the fourth transmission transistor M94.

According to the example embodiments of the present disclosure, the source follower transistor of the active pixel sensor uses the fingered type transistor. Thus, the channel width of the source follower transistor is increased, and the MOS device noise due to the source follower transistor may be reduced.

While the example embodiments of the present disclosure and their advantages have been described in detail, it shall be understood that various changes, substitutions and alterations may be made herein by those of ordinary skill in the pertinent art without departing from the scope of the invention.

What is claimed is:

1. A CMOS active pixel sensor, comprising:
  a photodiode for generating charge in response to incident light;
  a transmitting transistor for transmitting the charge stored in the photodiode to a sensing node;
  a dynamic voltage source for selectively providing a first power supply voltage and a second power supply voltage;
  a reset transistor, coupled to the dynamic voltage source, for resetting a voltage of the sensing node so that the sensing node has the fist power supply voltage; and
  a fingered type source follower transistor having a folded U-shaped gate electrode with a plurality of directly connected gate regions, a folded U-shaped source electrode with a plurality of directly connected source regions, and a drain electrode coupled to the dynamic voltage source, the fingered type source follower transistor receiving the voltage of the sensing node via the folded gate electrode to amplify the voltage of the sensing node and transmitting the amplified voltage into an internal circuit,
  wherein a channel width of the source-follower transistor is increased while a width of the fingered type source follower transistor is not increased in the longitudinal direction, so that the source-follower transistor is a symmetric structure.

2. The CMOS active pixel sensor of claim 1, wherein the dynamic voltage source supplies the first power supply voltage when the voltage of the sensing node is reset and the amplified voltage of the sensing node is transmitted into the internal circuit, and otherwise the dynamic voltage source supplies the second power supply voltage.

3. A CMOS active pixel sensor, comprising:
  a sensing node;
  a photodiode in signal communication with the sensing node for generating charge in response to incident light; and
  a fingered type source follower transistor having a folded U-shaped gate electrode with a plurality of directly connected gate regions in signal communication with the sensing node for amplifying the voltage of the sensing node, a folded U-shaped source electrode with a plurality of directly connected source regions, and a drain electrode, wherein a channel width of the source-follower transistor is increased while a width of the fingered type source follower transistor is not increased in the longitudinal direction, so that the source-follower transistor is a symmetric structure.

4. The CMOS active pixel sensor of claim 3, further comprising a reset transistor in signal communication with the sensing node for resetting a voltage level of the sensing node.

5. The CMOS active pixel sensor of claim 3, further comprising at least one of:
  a transmitting transistor in signal communication with the photodiode for transmitting the charge stored in the photodiode to the sensing node;
  a selecting transistor in signal communication with the fingered type source follower transistor for transmitting a voltage of a source electrode of the fingered type source follower transistor in response to a selection signal; or
  a dynamic voltage source in signal communication with the drain electrode of the fingered type source follower transistor for selectively providing a first power supply voltage and a second power supply voltage to a drain electrode of the fingered type source follower transistor.

6. The CMOS active pixel sensor of claim 4 wherein the reset transistor is coupled to a power supply voltage for resetting a voltage of the sensing node to a level of the power supply voltage.

7. The CMOS active pixel sensor of claim 6 wherein the power supply voltage is a dynamic voltage, further comprising a dynamic voltage source for selectively providing a first power supply voltage and a second power supply voltage to the drain electrode of the fingered type source follower transistor.

8. The CMOS active pixel sensor of claim 3, further comprising:
  a dynamic voltage source in signal communication with the fingered type source follower transistor for selectively providing a first power supply voltage and a second power supply voltage to a drain electrode of the fingered type source follower transistor; and
  at least one of a transmitting transistor in signal communication with the photodiode for transmitting the charge stored in the photodiode to the sensing node, or a selecting transistor in signal communication with the fingered type source follower transistor for transmitting a voltage of a source electrode of the fingered type source follower transistor in response to a selection signal.

* * * * *